United States Patent
Lee

(10) Patent No.: US 7,452,780 B2
(45) Date of Patent: Nov. 18, 2008

(54) METHOD OF FORMING A STABLE TRANSISTOR BY DUAL SOURCE/DRAIN IMPLANTATION

(75) Inventor: Kye-Nam Lee, Kyungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/320,301

(22) Filed: Dec. 29, 2005

(65) Prior Publication Data

US 2006/0148221 A1 Jul. 6, 2006

(30) Foreign Application Priority Data

Dec. 30, 2004 (KR) ...................... 10-2004-0117155

(51) Int. Cl.
*H01L 21/336* (2006.01)
(52) U.S. Cl. .................. 438/305; 438/528; 257/E21.64
(58) Field of Classification Search ................. 438/301, 438/303, 305, 528, 529
See application file for complete search history.

(56) References Cited

U.S. PATENT DOCUMENTS

| | | | | |
|---|---|---|---|---|
| 5,953,616 A | * | 9/1999 | Ahn | 438/305 |
| 6,008,098 A | * | 12/1999 | Pramanick et al. | 438/305 |
| 6,013,577 A | * | 1/2000 | Kimizuka | 438/659 |
| 6,037,204 A | * | 3/2000 | Chang et al. | 438/231 |
| 6,221,744 B1 | * | 4/2001 | Shih et al. | 438/585 |
| 6,335,253 B1 | * | 1/2002 | Chong et al. | 438/305 |
| 6,372,591 B1 | * | 4/2002 | Mineji et al. | 438/305 |
| 6,624,037 B2 | * | 9/2003 | Buynoski et al. | 438/305 |

* cited by examiner

*Primary Examiner*—Walter L Lindsay, Jr.
*Assistant Examiner*—Reema Patel
(74) *Attorney, Agent, or Firm*—Finnegan, Henderson, Farabow, Garrett & Dunner, L.L.P.

(57) ABSTRACT

A method of forming a transistor includes: forming a gate oxide layer and a gate polysilicon layer on a silicon substrate; forming low-energy ion implantation regions in the silicon substrate and in alignment with both sidewalls of the gate polysilicon layer; forming gate spacers on both sidewalls of the gate polysilicon layer; forming amorphous layers on surfaces of the gate polysilicon layer and the silicon substrate by implanting impurities at a low implantation energy into the gate polysilicon layer and the silicon substrate; and forming high-energy ion implantation regions by implanting source/drain impurities at a high implantation energy into the silicon substrate including the gate polysilicon layer and the amorphous layer.

3 Claims, 3 Drawing Sheets

METHOD OF FORMING A STABLE TRANSISTOR BY DUAL SOURCE/DRAIN IMPLANTATION

CROSS-REFERENCE TO RELATED APPLICATION

This application claims the benefit of priority to Korean Patent Application No. 10-2004-0117155, filed in the Korean Intellectual Property Office on Dec. 30, 2004, the entire contents of which are incorporated herein by reference.

BACKGROUND (a) Technical Field

The present invention relates to a method of forming a transistor. More particularly, the present invention relates to a method of forming a stable transistor by dual source/drain implantation.

(b) Description of the Related Art

A transistor generally includes a gate oxide layer and a gate polysilicon layer stacked together, and source and drain regions on both sides of the gate polysilicon layer. Hereinafter, a conventional method of forming a transistor will be described with reference to the accompanying drawings.

FIG. 1 and FIG. 2 are cross-sectional views showing a conventional method of forming a transistor.

Referring to FIG. 1, a gate oxide layer 12 and gate polysilicon layer 14 are formed on a silicon substrate 10. Subsequently, low energy ion implantation regions 16 are formed in substrate 10 and aligned with both sides of gate polysilicon layer 14. Pocket ion implantation regions 18 are formed below low energy ion implantation regions 16. Gate spacers 19 are formed on both sidewalls of gate polysilicon layer 14. As shown in FIG. 1, reference numeral 20 denotes columnar grains of gate polysilicon layer 14, and reference numeral 22 denotes a grain boundary of gate polysilicon layer 14.

Referring to FIG. 2, high energy ion implantation regions 26 are formed by implanting source/drain impurities 24 at a high implantation energy into an entire surface of silicon substrate 10. Gate polysilicon layer 14 and gate spacers 19 are used as an implantation mask for forming high energy ion implantation regions 26. Consequently, source and drain regions are composed of low energy ion implantation regions 16, pocket ion implantation regions 18, and high energy ion implantation regions 26.

According to the conventional method of forming a transistor, high-energy source/drain impurities 24 are ion-implanted after forming gate polysilicon layer 14. Some of impurities 24, such as fluorine, may reach a bottom of gate oxide layer 12 through grain boundary 22 between columnar grains 20 of the gate polysilicon layer 14, as denoted by reference numeral 28, and may damage silicon substrate 10, which damage may increase a leakage current and deteriorate the reliability and performance of a semiconductor device.

The above information disclosed in this Background section is only for enhancement of understanding of the background of the invention and therefore it may contain information that does not form the prior art that is already known in this country to a person of ordinary skill in the art.

SUMMARY

The present invention provides a method of forming a transistor having advantages of preventing penetration of impurities through a grain boundary.

A method of forming a transistor consistent with embodiments of the present invention includes: forming a gate oxide layer and a gate polysilicon layer on a silicon substrate; forming low-energy ion implantation regions in the silicon substrate and in alignment with both sidewalls of the gate polysilicon layer; forming gate spacers on both sidewalls of the gate polysilicon layer; forming amorphous layers on surfaces of the gate polysilicon layer and the silicon substrate by implanting impurities into the gate polysilicon and the silicon substrate at a low energy; and forming high-energy ion implantation regions by implanting source/drain impurities at a high implantation energy into the silicon substrate including the gate polysilicon layer and the amorphous layer.

The gate polysilicon layer may be formed on the gate oxide layer, and the low-energy ion implantation region may be formed by implanting impurities at 5 KeV or less.

Pocket ion implantation regions may be formed below the low-energy ion implantation regions to prevent a punch-through phenomenon.

The gate spacers are formed on both sidewalls of the gate polysilicon layer to increase a hot carrier margin.

The amorphous layer formed on the gate polysilicon layer reduces a grain size of the gate polysilicon layer below the amorphous layer.

Consistent with embodiments of the present invention, damage of the gate oxide layer caused by the penetration of impurities can be prevented because a crystallization defect, such as an amorphous crystal structure, is formed on the gate polysilicon layer.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings.

DETAILED DESCRIPTION OF THE EMBODIMENTS

Figure 1:
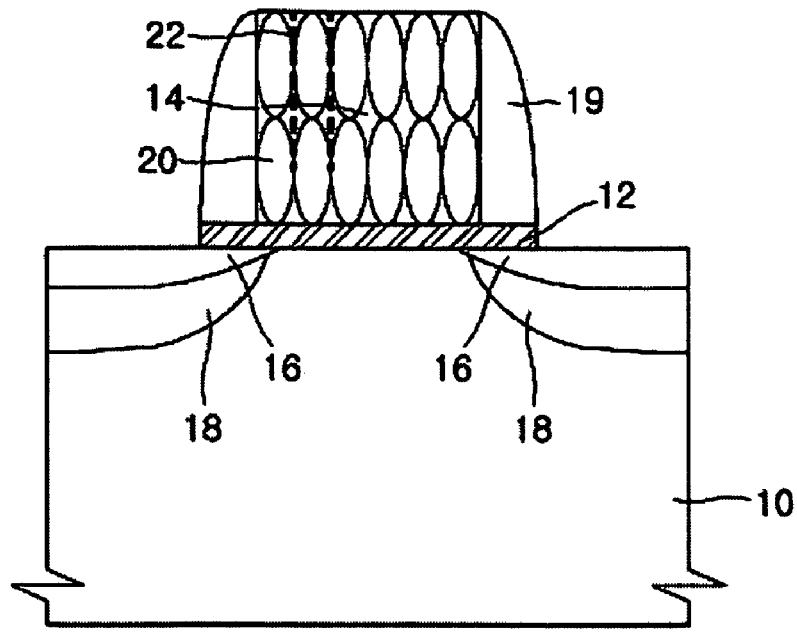
FIG. 1 and FIG. 2 are cross-sectional views showing a conventional method of forming a transistor.
Figure 2:
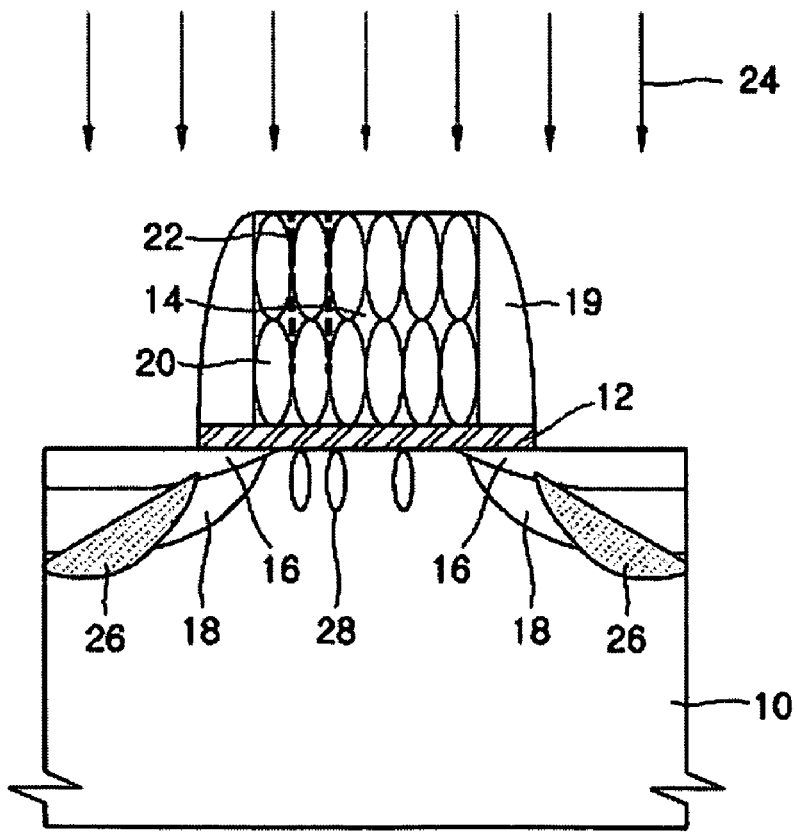

Embodiments of the present invention will hereinafter be described in detail with reference to the accompanying drawings.

To clarify multiple layers and regions, the thicknesses of the layers are enlarged in the drawings. Like reference numerals designate like elements throughout the specification. When it is said that any part, such as a layer, film, area, or plate is positioned on another part, it means the part is directly on the other part or above the other part with at least one intermediate part. On the other hand, if any part is said to be positioned directly on another part it means that there is no intermediate part between the two parts.

Figure 3:
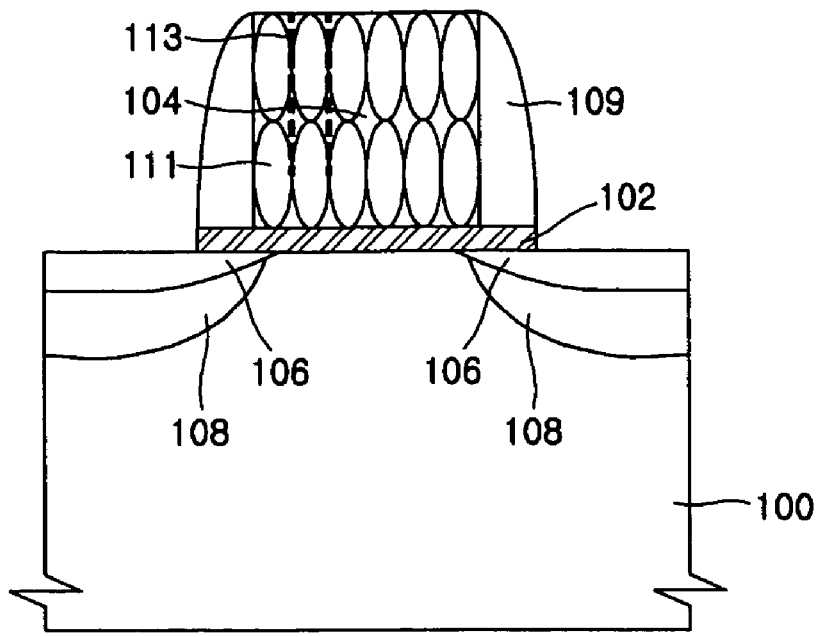
FIG. 3 to FIG. 5 are cross-sectional views showing a method of forming a transistor consistent with embodiments of the present invention.
Figure 4:
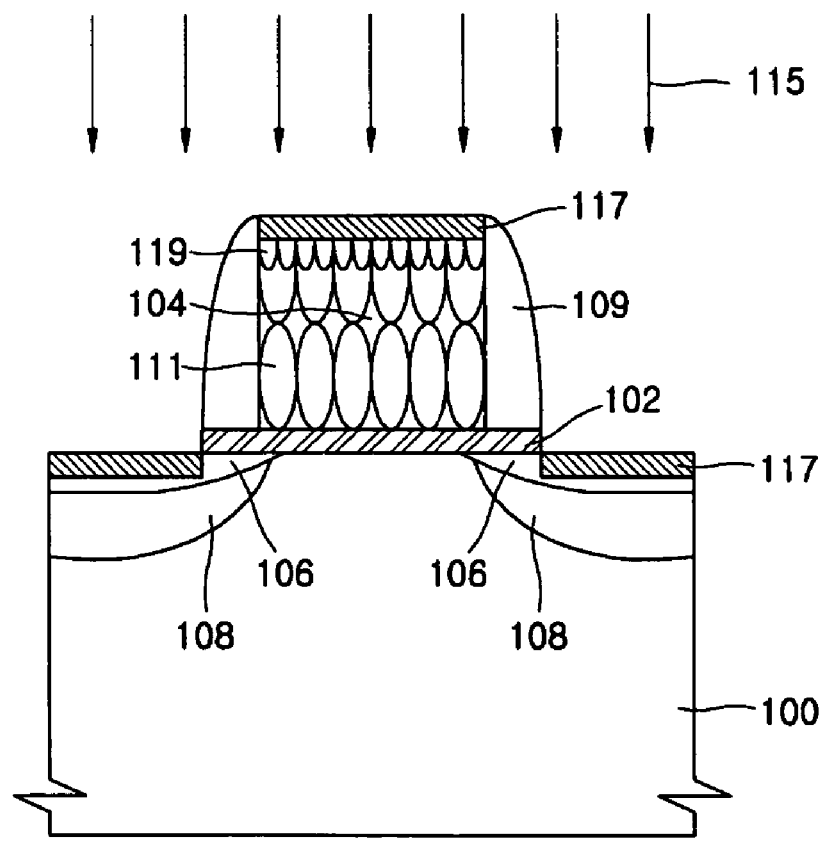
Figure 5:
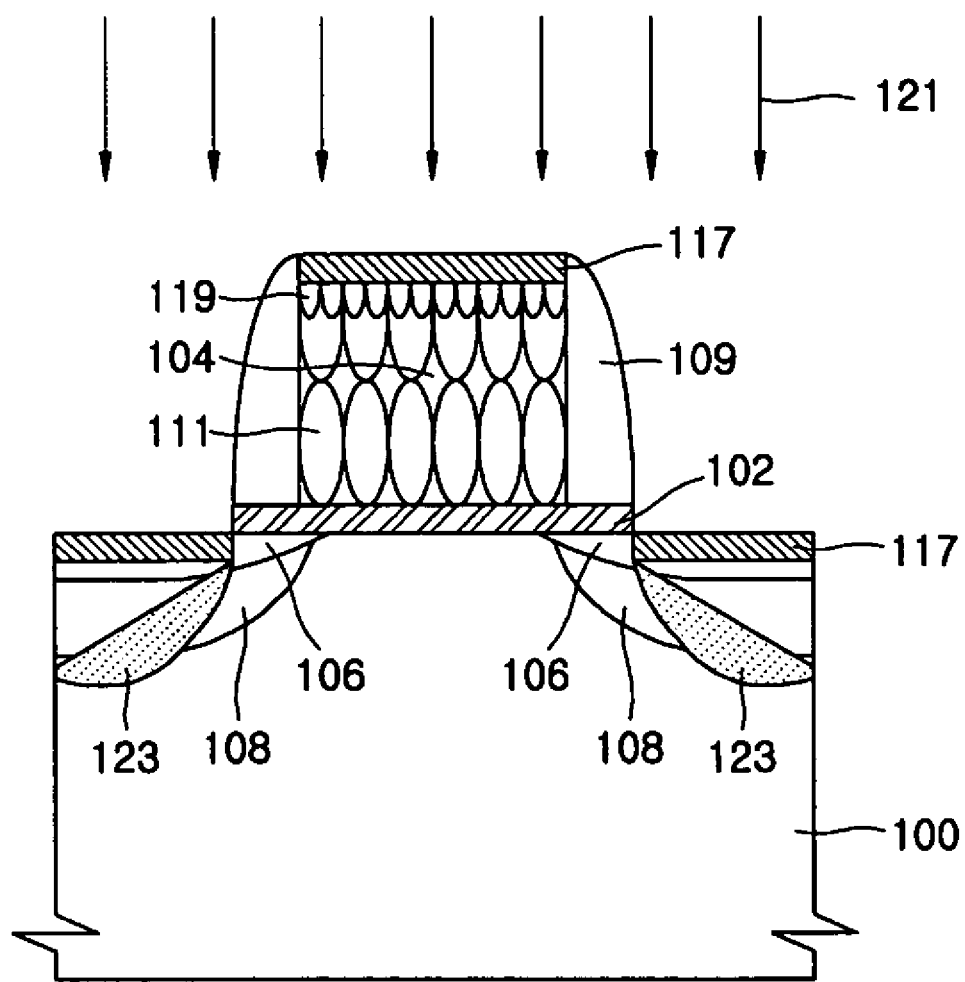

FIG. 3 to FIG. 5 are cross-sectional views showing a method of forming a transistor consistent with embodiments of the present invention.

Referring to FIG. 3, a gate oxide layer 102 and gate polysilicon layer 104 are formed on a silicon substrate 100. Subsequently, low energy ion implantation regions 106 are formed in substrate 100 and aligned with both sides of gate polysilicon layer 104. Pocket ion implantation regions 108 are formed below low energy ion implantation regions 106. Low energy ion implantation region 106 are formed by performing an ion implantation at 5 KeV or less. Pocket ion implantation regions 108 prevent a punch-through phenomenon.

Subsequently, gate spacers 109 are formed on both sidewalls of gate polysilicon layer 104. Gate spacers 109 are formed in order to increase a hot carrier margin. As shown in FIG. 3, reference numeral 111 denotes columnar grains within gate polysilicon layer 104, and reference number 113 denotes a grain boundary between columnar grains 111 of gate polysilicon layer 104.

Referring to FIG. 4, ions 115 are implanted into silicon substrate 100 and gate polysilicon layer 104 at a low implantation energy, e.g., 5 KeV or less, to form an amorphous layer 117 on surfaces of gate polysilicon layer 104 and silicon substrate 100. As a result, a grain size in a portion of gate polysilicon layer 104 near amorphous layer 117 decreases, as denoted by reference numeral 119 in FIG. 4.

Referring to FIG. 5, high energy ion implantation regions 123 are formed by implanting source/drain impurities 121 at a high implantation energy, e.g., about 15 keV or more, into an entire surface of silicon substrate 100 including the gate polysilicon layer 104 and the amorphous layer 117. Consequently, source/drain regions comprise low energy ion implantation regions 106, pocket ion implantation regions 108, and high energy ion implantation regions 123. Consistent with embodiments of the present invention, impurities, such as fluorine, implanted at a high energy such as 15 keV or more, cannot damage silicon substrate 100 through gate polysilicon layer 104, because of amorphous layer 117 formed on gate polysilicon layer 104. As a result, a leakage current caused by possible damage to gate oxide 102 is avoided.

In addition, when heat treatment is performed at about 1050° C. after the high energy ion implantation, a uniformity of the resistance of gate polysilicon layer 104 can be improved. Also, when a silicide forming process for enhancing an operation speed of a device is performed, damage of the surface of the gate polysilicon layer and non-uniform resistance of the gate polysilicon layer are prevented.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a transistor, comprising:
    forming a gate oxide layer and a gate polysilicon layer on a silicon substrate;
    forming low-energy ion implantation regions in the silicon substrate and in alignment with both sidewalls of the gate polysilicon layer by implanting impurities into the silicon substrate at an implantation energy of about 5 KeV or less;
    forming gate spacers on both sidewalls of the gate polysilicon layer;
    forming amorphous layers on surfaces of the gate polysilicon layer and the silicon substrate by implanting impurities into the gate polysilicon and the silicon substrate at an implantation energy of about 5 KeV or less, wherein the amorphous layers are formed in the silicon substrate at a depth which is shallower than a depth at which the low-enemy ion implantation regions are formed in the silicon substrate; and
    forming high energy ion implantation regions by implanting source/drain impurities at a high implantation energy into the silicon substrate including the gate polysilicon layer and the shallow amorphous layers.

2. The method of claim 1, wherein forming the gate oxide layer and the gate polysilicon layer comprises forming the gate polysilicon layer on the gate oxide layer.

3. The method of claim 1, wherein pocket ion implantation region are formed below the low-energy ion implantation regions.

* * * * *